US007282866B2

(12) United States Patent
Nakanishi

(10) Patent No.: US 7,282,866 B2
(45) Date of Patent: Oct. 16, 2007

(54) DISCHARGE LAMP LIGHTING APPARATUS

(75) Inventor: Hiroyuki Nakanishi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/340,605

(22) Filed: Jan. 27, 2006

(65) Prior Publication Data

US 2006/0170377 A1 Aug. 3, 2006

(30) Foreign Application Priority Data

Jan. 31, 2005 (JP) ............................ 2005-024145

(51) Int. Cl.
*H05B 37/02* (2006.01)
*H01L 41/08* (2006.01)

(52) U.S. Cl. .......................... 315/209 PZ; 310/316.01

(58) Field of Classification Search ................ 315/291, 315/307, 225, 219, 209 R, 224; 310/316.01, 310/317, 318, 319, 320
See application file for complete search history.

(56) References Cited

U.S. PATENT DOCUMENTS 6,087,757 A 7/2000 Honbo et al.
6,674,251 B2 * 1/2004 Langeslag et al. .......... 315/291
6,759,811 B2 * 7/2004 Okamoto et al. ........... 315/291
6,972,531 B2 * 12/2005 Krummel .................... 315/309
7,081,709 B2 * 7/2006 Pak ............................ 315/101
2003/0173911 A1 * 9/2003 Ohsawa ...................... 315/291

FOREIGN PATENT DOCUMENTS

JP A 2004-241136 8/2004

* cited by examiner

*Primary Examiner*—Shih-Chao Chen
*Assistant Examiner*—Minh Dieu A
(74) *Attorney, Agent, or Firm*—Oliff & Berridge, PLC

(57) ABSTRACT

The present invention provides a discharge lamp lighting apparatus for lighting a discharge lamp having two electrodes, having: a first drive circuit, a second drive circuit, and a control circuit. The first drive circuit is connectable to one of the two electrodes to supply a first alternating current to the discharge lamp. The first alternating current has a frequency and a first effective value. The second drive circuit is connectable to the other of the two electrodes to supply a second alternating current to the discharge lamp. The second alternating current has the frequency and a second effective value. The second alternating current has an opposite phase to the first alternating current. The control circuit generates first and second drive pulses to drive the first and second drive circuits, respectively. The first and second drive pulses have a phase difference therebetween. The control circuit adjusts the phase difference to match the first and second effective values.

1 Claim, 4 Drawing Sheets

FIG.4
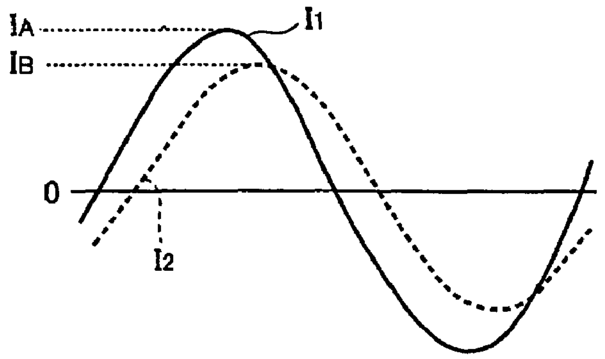
FIG.5
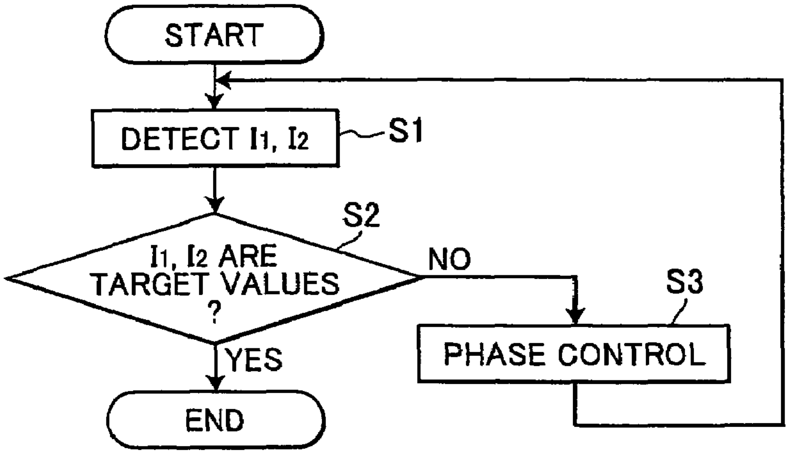
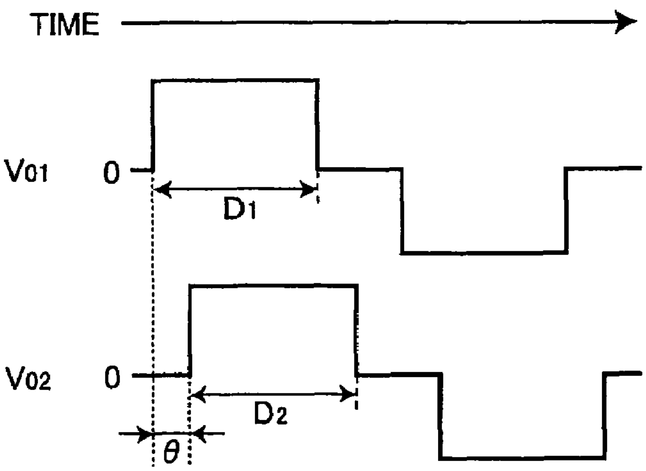
FIG.6A
FIG.6B

DISCHARGE LAMP LIGHTING APPARATUS

BACKGROUND OF THE INVENTION

1. Technical Field

The present invention relates to a discharge lamp lighting device that controls a discharge lamp having two electrodes. In particular, the present invention relates to a discharge lamp lighting device that controls a discharge lamp used as a backlight for various display panels such as big screen television sets.

2. Related Art

Recently, a cold-cathode fluorescent lamp (designated as "CCFL" hereinafter) used as a backlight for a liquid crystal panel is prone to be long, since the liquid crystal panel is becoming larger in size. When a high voltage is applied across the CCFL through one electrode thereof to light up the CCFL, the CCFL may have non-uniform brightness along the longitudinal direction thereof.

Japanese Patent Application Publication 2004-241136 discloses a discharge lamp lighting device including a pair of inverter circuits, in which one of the inverter circuits as a master inverter circuit is connected to one of two electrodes of the lamp, and the other inverter circuit as a slave inverter circuit is connected to the other electrode of the lamp. The lamp is lighted up by applying a high voltage across the lamp through each of the electrodes. This method of lighting the lamp is designated as "a differential drive method".

However, characteristics of the master inverter circuit and the slave inverter circuit do not always coincide with each other. Therefore, current flows supplied from the inverter circuits may become unbalanced even if the same voltage is applied across the respective inverter circuits to light up the CCFL by the differential drive method.

Accordingly, a method is suggested to adjust duties of output voltages supplied from the two inverter circuits, respectively, to equalize the amounts of current flows from the two inverter circuits. However, when this method is employed, the duties of the inverters are generally different from each other. Therefore, the inverter circuit which generates a larger duty pulse is required to have a larger derating, which raises a problem against downsizing of the discharge lamp lighting device.

To overcome the above-mentioned drawbacks, an object of the present invention is to provide a discharge lamp lighting device that can easily equalize amounts of current flows flowing into a discharge lamp through each of the electrodes of the lamp without enlarging a derating of the inverter circuit.

SUMMARY

The present invention provides a discharge lamp lighting apparatus for lighting a discharge lamp having two electrodes, having: a first drive circuit, a second drive circuit, and a control circuit. The first drive circuit is connectable to one of the two electrodes to supply a first alternating current to the discharge lamp. The first alternating current has a frequency and a first effective value. The second drive circuit is connectable to the other of the two electrodes to supply a second alternating current to the discharge lamp. The second alternating current has the frequency and a second effective value. The second alternating current has an opposite phase to the first alternating current. The control circuit generates first and second drive pulses to drive the first and second drive circuits, respectively. The first and second drive pulses have a phase difference therebetween. The control circuit adjusts the phase difference to match the first and second effective values.

BRIEF DESCRIPTION OF THE DRAWINGS

The aforementioned aspects and other features of the invention are explained in the following description, taken in connection with the accompanying drawing figures wherein:

FIG. 4 shows one example of alternating currents from the first and second drive circuits;

FIG. 5 shows a flowchart of a method of adjusting the alternating currents;

FIGS. 6A and 6B show wave charts of output voltages of the switching circuits;

DESCRIPTION OF THE EMBODIMENT

An embodiment according to the present invention will be described below with reference to the accompanying drawings.

Figure 1:
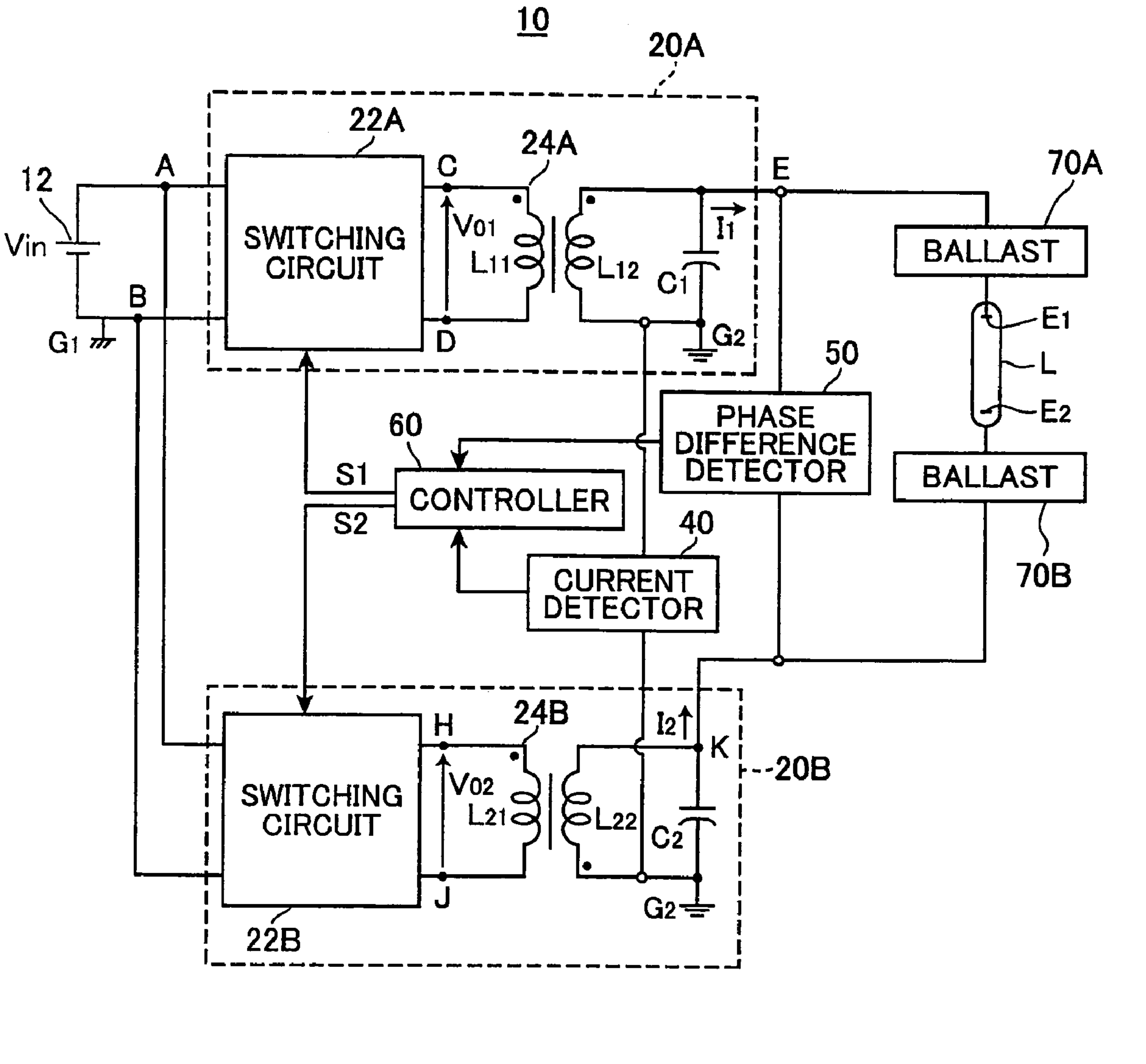
FIG. 1 shows a block diagram of a discharge lamp lighting device of one embodiment according to the present invention.

FIG. 1 shows a discharge lamp lighting device 10 according to an embodiment of the present invention. The discharge lamp lighting device 10 feeds electric power from a power supply to a discharge lamp L to light the discharge lamp L. The discharge lamp lighting device 10 includes a first drive circuit 20A, a second drive circuit 20B, an electric current detector 40, a phase difference detector 50, and a control circuit 60. The discharge lamp L controlled by the discharge lamp lighting device 10 is a CCFL that has electrodes $E_1$, $E_2$ at both ends thereof, respectively. In the following description, a voltage value, a current value, and an electric power value refer to an effective value, respectively, if not otherwise specified.

The first drive circuit 20A includes a first switching circuit 22A, a first transformer 24A, and a first resonant capacitor $C_1$ to configure an inverter circuit. Output terminals A, B of a power supply 12 are connected to input terminals of the first switching circuit 22A, respectively, so that a direct-current voltage $V_{in}$ is applied across the first switching circuit 22A by the power supply 12. The terminal B is connected to a reference potential $G_1$. The first switching circuit 22A performs a switching operation in response to a control signal $S_1$ having a switching frequency $f_1$ supplied from the control circuit 60.

The first transformer 24A includes a primary coil $L_{11}$ and a secondary coil $L_{12}$ which are wound in the manner that the polarity of the primary coil $L_{11}$ is oriented in the same direction as the polarity of the secondary coil $L_{12}$. The first transformer 24A has a predetermined leakage inductance Both ends of the primary coil $L_{11}$ are connected to output terminals C, D of the first switching circuit 22A, respectively. The first resonant capacitor $C_1$ is connected in parallel to the secondary coil $L_{12}$. One end of the first resonant capacitor $C_1$ is connected to a reference potential $G_2$.

Figure 2A:
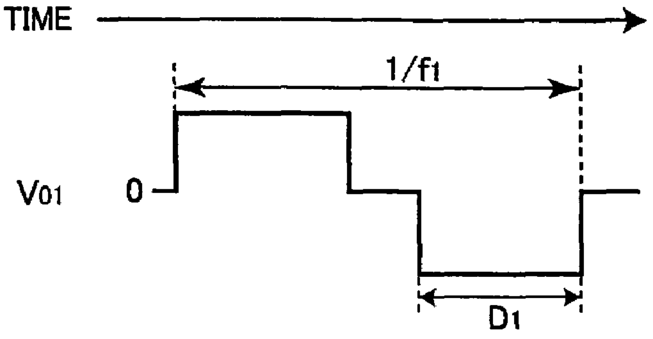
FIGS. 2A and 2B show waveform of output voltages from first and second switching circuits.

With the above-described configuration, the first switching circuit 22A converts the direct-current voltage $V_{in}$ to a first alternating voltage $V_{O1}$ to output the alternating voltage $V_{O1}$ through the terminals C and D. In other words, the first switching circuit 22A supplies the alternating voltage $V_{O1}$ to the first transformer 24A through the terminals C and D. The first alternating voltage $V_{O1}$ has a square waveform with the switching frequency $f_1$ and the duty $D_1$ with the elapse of the time in synchronization with the switching frequency $f_1$ of the control signal $S_1$ (see FIG. 2A). The first drive circuit 20A is connected to the electrode $E_1$ of the discharge lamp L through an output terminal E and a ballast circuit 70A.

Figure 3:
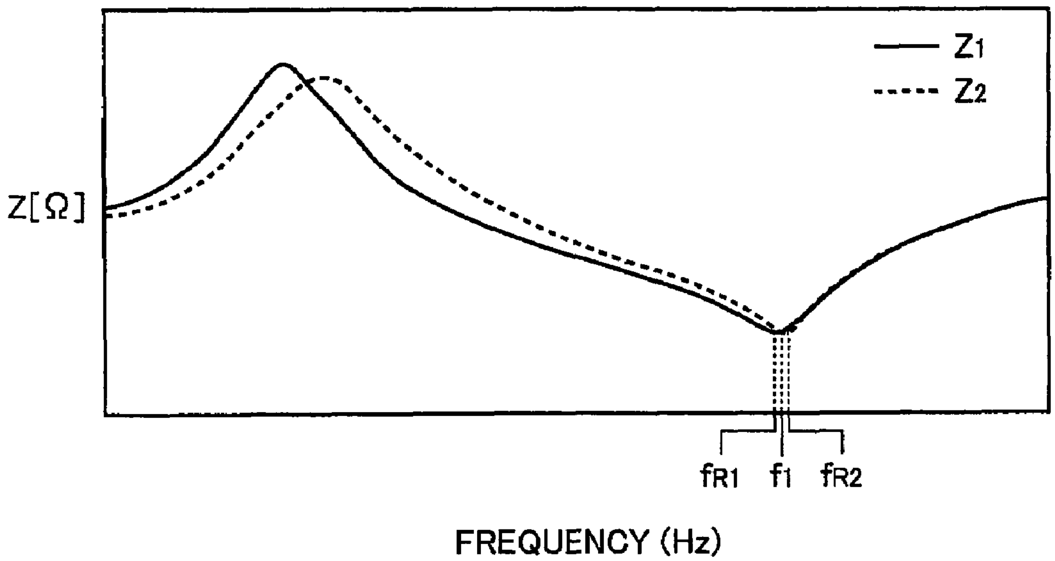
FIG. 3 shows impedance characteristics of the discharge lamp lighting device from an output side of each of the first and second drive circuits.
Figure 7:
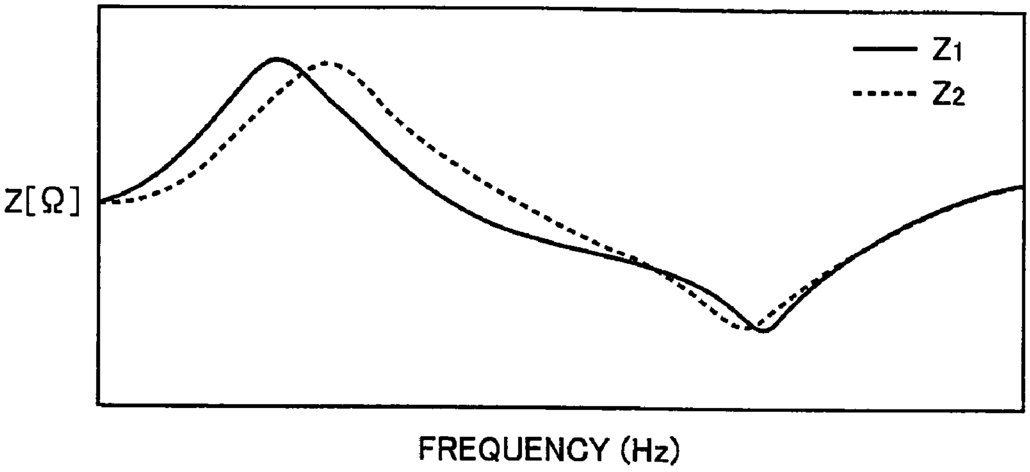
FIG. 7 shows impedance characteristics of the discharge lamp lighting device from the respective output sides of the first and second drive circuits.

The leakage inductance of the first transformer 24A and the first resonant capacitor $C_1$ form a series resonant circuit having a resonant frequency $f_{R1}$ in the first drive circuit 20A. Accordingly, if the switching frequency $f_1$ of the first switching circuit 22A is set in proximity to the resonant frequency $F_{R1}$, the first drive circuit 20A is able to apply an optimum high voltage to the discharge lamp L. FIG. 3 shows the impedance characteristics $Z_1$ of the discharge lamp lighting device 10 obtained at an output side of the first drive circuit 20A.

The second drive circuit 20B includes a second switching circuit 22B, a second transformer 24B, and a second resonant capacitor $C_2$ to configure an inverter circuit. The output terminals A, B of the power supply 12 are connected to both input terminals of the second switching circuit 22B, respectively, so that the direct-current voltage $V_{in}$ is applied across the second switching circuit 22B by the power supply 12. The second switching circuit 22B performs a switching operation in response to a control signal $S_2$ having the switching frequency $f_1$ supplied from the control circuit 60.

The second transformer 24B includes a primary coil $L_{21}$ and a secondary coil $L_{22}$ which are wound in the manner that the polarity of the primary coil $L_{21}$ is oriented in a reverse direction as the polarity of the secondary coil $L_{22}$. Both ends of the primary coil $L_{21}$ are connected to output terminals H, J of the second switching circuit 22B, respectively. The second resonant capacitor $C_2$ is connected in parallel with the secondary coil $L_{22}$. One end of the second resonant capacitor $C_2$ is connected to the reference potential $G_2$.

Figure 2B:
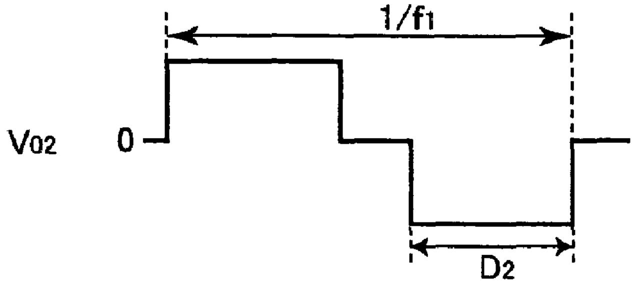

With the above-described configuration, the second switching circuit 22B converts the direct-current voltage $V_{in}$ to a second alternating voltage $V_{O2}$ to output the second alternating voltage $V_{O2}$ through the terminals H and J. In other words, the second switching circuit 22B supplies the alternating voltage $V_{O1}$ to the second transformer 24B through the terminals H and J. The second alternating voltage $V_{O2}$ has a square waveform with the switching frequency $f_1$ and duty $D_2$ with the elapse of the time in synchronization with the switching frequency $f_1$ of the control signal $S_2$ (see FIG. 2B). The first drive circuit 20B is connected to the electrode $E_2$ of the discharge lamp L through an output terminal K and another ballast circuit 70B.

A leakage inductance of the second transformer 24B and the second resonant capacitor $C_2$ form a series resonant circuit having a resonant frequency $f_{R2}$ in the second drive circuit 20B. Therefore, if the switching frequency $f_1$ of the second switching circuit 22B is in proximity to the resonant frequency $f_{R2}$, the second drive circuit 20B is able to apply an optimum high voltage to the discharge lamp L. FIG. 3 shows the impedance characteristics $Z_2$ of the discharge lamp lighting device 10 obtained at an output side of the second drive circuit 20B.

Furthermore, in the first and second drive circuits 20A, 20B, the first and second switching circuits 22A, 22B are manufactured under the same conditions to have the same specifications. For example, the first and second switching circuits 22A, 22B are configured to have the same impedance so as to output the same voltage based on the same input direct-current voltage, respectively.

The first and second transformers 24A, 24B are also manufactured under the same conditions to have the same specifications. The first and second transformers 24A, 24B are configured to have the same transformer ratio, leakage inductances, and resistances with each other.

Moreover, the first and second resonant capacitors $C_1$, $C_2$ are also manufactured under the same conditions to have the same specifications. For example, the first and second resonant capacitors $C_1$, $C_2$ have the same capacitances. Since the first drive circuit 20A and the second drive circuit 20B are composed of electric components which are configured to have the same specifications, the circuits 20A and 20B are considered to be provided with the same characteristics.

The electric current detector 40 detects alternating currents $I_1$, $I_2$ which are flowing from the first and second drive circuits 20A, 20B to the discharge lamp L to send an output signal corresponding to the detected currents $I_1$, $I_2$to the control circuit 60. The phase difference detector 50 detects a phase difference $\Delta\theta$ between the alternating currents $I_1$, $I_2$ to send an output signal corresponding to the detected phase difference to the control circuit 60.

The control circuit 60 sets up the frequency, the duty, and the timing of switching operation in the switching circuits 22A, 22B of the first and second drive circuits 20A, 20B based on the output signals sent from the electric current detector 40 and the phase difference detector 50 to supply the control signals $S_1$, $S_2$ including these values to the respective switching circuits 22A, 22B. The control circuit 69 performs a phase control for the drive circuits 20A, 20B, so that the control circuit 60 sets up the identical frequency $f_1$ of the switching operation for the respective drive circuits 20A, 20B.

On the other hand, the control circuit 60 individually sets up the duties $D_1$, $D_2$ and the timing of switching operation for the respective switching circuits 22A, 22B. Using the control signals $S_1$, $S_2$, the control circuit 60 controls the first and second alternating currents $I_1$, $I_2$.

Next, the operation of the discharge lamp lighting device 10 will be described. In the first drive circuit 20A, when the control signal $S_1$ is input to the first switching circuit 22A from the control circuit 60, the first switching circuit 22A converts the input voltage $V_{in}$ to a high-frequency alternating voltage with the frequency $f_1$, the duty $D_1$, and the amplitude $V_{O1}$, and applies the alternating voltage across the first transformer 24A.

The first transformer 24A then changes the amplitude $V_{O1}$ depending on the transformer ratio to generate the first alternating current $I_1$ at the terminal E. The current $I_1$ flows through the electrode $E_1$ into the discharge lamp L as a lamp current.

Similarly, in the second drive circuit 20B, when the control signal $S_2$ is input to the second switching circuit 22B from the control circuit 60, the second switching circuit 22B converts the input voltage $V_{in}$ to a high-frequency alternating voltage with the frequency $f_1$, the duty $D_2$, and the amplitude $V_{O2}$ to apply the alternating voltage across the second transformer 24B.

The second transformer 24B changes the amplitude depending on the transformer ratio to generate the second alternating current $I_2$ at the terminal K. The current $I_2$ flows through the electrode $E_2$ into the discharge lamp L as a lamp current.

As described above, the alternating currents $I_1$, $I_2$ are supplied to the discharge lamp L through the both electrodes $E_1$, $E_2$ to light up the discharge lamp L.

At this time, if effective values of the alternating currents $I_1$, $I_2$ are equal to each other, the power of the discharge lamp L lighted by the bilateral drive method is considered to be balanced. Therefore, further phase control for the alternating current $I_1$, $I_2$ is not necessary.

Referring to FIG. 3, the switching frequency $f_1$ in proximity to the resonant frequencies $f_{R1}$, $f_{R2}$ is selected in order to apply a nearly maximum voltage to the discharge lamp for lighting. This is because the impedance of the discharge lamp lighting device 10 becomes substantially minimum at the frequency $f_1$ so that the voltage applied to the discharge lamp L can be maximized.

Generally, the first and second drive circuits 20A, 20B are provided so as to have the same characteristics such as frequency impedance characteristics, because the corresponding electric parts in each of the first and second drive circuits 20A, 20B are selected to have the same specifications, i.e., the same characteristics such as a capacitance, and inductance, and an impedance. However, the resonant frequencies $f_{R1}$, $f_{R2}$ do not match due to manufacture errors and/or tolerances of respective components in each drive circuit. Accordingly, the impedance characteristics of the first and second drive circuits 20A, 20B tend to be different from each other. In this description, electric components and/or circuits having the same specifications refer to components which are manufactured to have the same nominal characteristic value including a manufacturing error and/or an allowable tolerance of the characteristics. Therefore, the characteristic values of the corresponding components in the first and second drive circuits 20A, 20B are not always coincident with each other completely, even if the corresponding components are manufactured to have the same nominal characteristics.

In general, respective components have approximately ±5% of the manufacture error and/or allowable tolerance of the characteristics. Accordingly, if the switching frequency $f_1$ is set in proximity to the resonant frequencies, and impedances of the first and second drive circuits 20A, 20B do not match, the alternating currents $I_1$, $I_2$ generated by the output waveforms from the first and second switching circuits having the identical duties come to be different from each other, as shown in FIG. 4. In FIG. 4, $I_A$ is the effective value of the current $I_1$, and $I_B$ is the effective value of the current $I_2$ (where $I_A>I_B$) That is, when the alternating currents $I_1$, $I_2$ are different from each other, a drive circuit generating a larger current has more workload, compared with the other drive circuit generating less current. Therefore, the alternating currents $I_1$, $I_2$ are required to be adjusted to equal each other.

Next, the method of adjusting the lamp currents $I_1$, $I_2$ will be described, referring to FIG. 5. First, the first and second drive circuits 20A, 20B each is driven using the control signals $S_1$, $S_2$, having the same phase, and starts supplying the alternating currents $I_1$, $I_2$ to the discharge lamp L. The electric current detector 40 then detects effective values of the alternating currents $I_1$, $I_2$, respectively (step S1). Next, the control circuit 60 determines whether the detected effective values of the alternating currents $I_1$, $I_2$ are target current values (step S2). If both of effective values of the alternating currents $I_1$, $I_2$ are the target current values (step S2; YES), an adjustment of the alternating currents $I_1$, $I_2$ is not necessary. If both of effective values of the alternating currents $I_1$, $I_2$ do not match the target current values (step S2; NO), the procedure goes to step S3.

Figure 8:
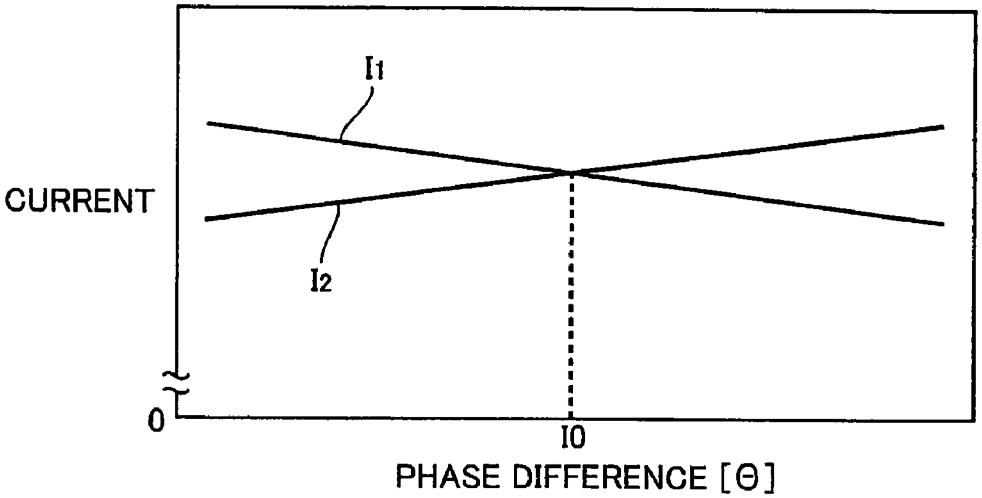
FIG. 8 shows a diagram indicative of a change in effective values of the alternating currents when the phase difference therebetween is adjusted.
Figure 9:
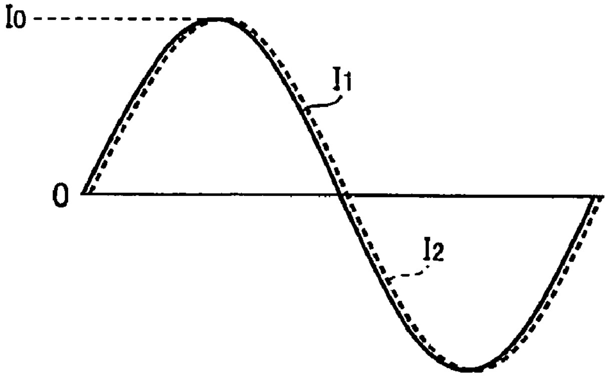
FIG. 9 shows a diagram indicative of one example of alternating currents which are adjusted to have the same effective values.

In step S3, phase control is performed to adjust alternating currents $I_1$, $I_2$. As shown in FIGS. 6A and 6B, when a phase difference θ between the first alternating voltage $V_{O1}$ and the second alternating voltage $V_{O2}$ is adjusted by changing phase difference θ of the control signal $S_2$ relative to the control signal $S_1$, the impedances $Z_1$, $Z_2$ of the discharge lamp lighting device 10 from the output side of the first and second drive circuits 20A, 20B change, respectively. In other words, between the effective values $I_A$, $I_B$ (where $I_A>I_B$), as the larger effective value decreases, and the smaller effective value increases, so that both of effective values $I_1$, $I_2$ become to come close to each other, as shown in FIG. 8. As a result, the effective current values $I_1$, $I_2$ can become to match an effective value $I_o$ of a target current value. FIG. 9 shows one example of the adjusted alternating currents $I_1$, $I_2$. As shown in FIG. 9, the alternating currents $I_1$, $I_2$ have the same effective values. And the phase difference between $I_1$, $I_2$ is substantially zero. As shown in FIGS. 6A and 6B, the duties $D_1$, $D_2$ of the output voltages $V_{O1}$, $V_{O2}$ are substantially equal to each other. However, leading edges of the voltages $V_{O1}$, $V_{O2}$ are not coincident with each other due to the phase control.

As described above, if the phase difference θ between the control signals for setting up the timing of switching operation of the respective switching circuits is adjusted, the effective values of the lamp currents $I_1$, $I_2$ can become to be equal to each other without increasing the difference between the duties of the output voltages $V_{O1}$, $V_{O2}$. Since the duties of the output voltages $V_{O1}$, $V_{O2}$ are substantially identical, loads of the respective drive circuits 20A, 20B such as impedances during the operation become substantially identical. Accordingly, the first and second drive circuits 20A, 20B do not need large derating, which can downsize the discharge lamp lighting device 10.

When the drive circuits 20A, 20B are composed of electric components manufactured under the same standard each of which has approximately ±5% of manufacture error and/or tolerance, and the drive circuits 20A, 20B are driven with a switching frequency in proximity of the resonant frequencies, the effective values of the alternating currents $I_1$, $I_2$ can become equal to each other by adjusting the phases of the alternating currents $I_1$, $I_2$.

Since the alternating-current powers $P_1$, $P_2$ supplied from the electrodes $E_1$, $E_2$ into the lamp L are substantially identical, the discharge lamp L can be lighted with a uniform luminance along a longitudinal direction of the lamp L.

Instead of the direct-current power supply 12, an alternating-current power supply can be used by rectifying an alternating voltage thereof in order to supply a direct current voltage to the respective drive circuits 20A, 20B.

Furthermore, the discharge lamp lighting device 10 can light a plurality of discharge lamps, "n" of discharge lamps connected in parallel. The ballast circuits 70A, 70B can be removed, depending on an application of the discharge lamp lighting device 10 therefor.

In above-described description, the respective electric components are manufactured under the same specifications. However, when the phase control for the discharge lamp L is performed, electric components having different specifications can be used, if necessary.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

What is claimed is:

1. A discharge lamp lighting apparatus for lighting a discharge lamp having two electrodes, comprising:

a first drive circuit connectable to one of the two electrodes to supply a first alternating current to the discharge lamp, the first alternating current having a frequency and a first effective value;

a second drive circuit connectable to the other of the two electrodes to supply a second alternating current to the discharge lamp, the second alternating current having the frequency and a second effective value, the second alternating current having an opposite phase to the first alternating current; and a control circuit for generating first and second drive pulses to drive the first and second drive circuits, respectively, the first and second drive pulses having a phase difference therebetween; and a detector for detecting the first effective value to generate a first output value, the detector detecting the second effective value to generate a second output value, wherein, the control circuit compares the first output value with the second output value, and adjusts the phase difference so as to increase a smaller one of the first and second output values and decrease a greater one of the first and second output values, thereby matching the first and second effective values.

* * * * *